US011783171B2

(12) United States Patent
Ido et al.

(10) Patent No.: US 11,783,171 B2
(45) Date of Patent: Oct. 10, 2023

(54) COMPUTING CIRCUITRY

(71) Applicant: Cirrus Logic International Semiconductor Ltd., Edinburgh (GB)

(72) Inventors: Toru Ido, Edinburgh (GB); David Paul Singleton, Edinburgh (GB); Gordon James Bates, Edinburgh (GB); John Anthony Breslin, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 992 days.

(21) Appl. No.: 16/554,984

(22) Filed: Aug. 29, 2019

(65) Prior Publication Data

US 2021/0064979 A1 Mar. 4, 2021

(51) Int. Cl.
  *G06N 3/065* (2023.01)
  *H03M 1/74* (2006.01)
(52) U.S. Cl.
  CPC ............ *G06N 3/065* (2023.01); *H03M 1/745* (2013.01)
(58) Field of Classification Search
  CPC .................................................... G06N 3/0635
  USPC ............................................................ 706/36
  See application file for complete search history.

(56) References Cited

U.S. PATENT DOCUMENTS

| 1,606,764 | A | * | 11/1926 | Hartley | H04L 13/04 |
| | | | | | 361/240 |
| 3,142,822 | A | * | 7/1964 | Martin | G11C 27/024 |
| | | | | | 365/45 |
| 4,092,639 | A | * | 5/1978 | Schoeff | H03M 1/745 |
| | | | | | 341/154 |
| 6,252,534 | B1 | * | 6/2001 | Timko | H03M 1/687 |
| | | | | | 341/145 |

(Continued)

OTHER PUBLICATIONS

G. Papandroulidakis, A. Serb, A. Khiat, G. V. Merrett and T. Prodromakis, "Practical Implementation of Memristor-Based Threshold Logic Gates," in IEEE Transactions on Circuits and Systems I: Regular Papers, vol. 66, No. 8, pp. 3041-3051, Mar. 22, 2019, doi: 10.1109/TCSI.2019.2902475. (Year: 2019).*

(Continued)

*Primary Examiner* — James D. Rutten
(74) *Attorney, Agent, or Firm* — Jackson Walker L.L.P

(57) ABSTRACT

This application relates to computing circuitry (200, 500, 600) for analogue computing. A plurality of current generators (201) are each configured to generate a defined current ($I_{D1}, I_{D2}, \ldots I_{Dj}$) based on a respective input data value ($D_1, D_2, \ldots D_j$). A memory array (202), having at least one set (204) of programmable-resistance memory cells (203), is arranged to receive the defined currents from each of the current generators at a respective signal line (206). Each set (204) of programmable-resistance memory cells (203) includes a memory cell associated with each signal line that, in use, can be connected between the relevant signal line and (Continued)

a reference voltage so as to generate a voltage on the signal line. An adder module (207) is coupled to each of the signal lines to generate a voltage at an output node (210) based on the sum of the voltages on each of the signal lines.

20 Claims, 4 Drawing Sheets

(56) References Cited

U.S. PATENT DOCUMENTS

| | | | | |
|---|---|---|---|---|
| 7,359,888 B2* | 4/2008 | Snider | ................... | H01L 27/092 |
| | | | | 706/26 |
| 2003/0038669 A1* | 2/2003 | Zhang | ................... | G11C 5/145 |
| | | | | 327/536 |
| 2009/0292661 A1* | 11/2009 | Haas | ...................... | G06N 3/088 |
| | | | | 706/33 |
| 2010/0066465 A1* | 3/2010 | Huang | ................ | H03H 19/004 |
| | | | | 333/173 |
| 2011/0182104 A1* | 7/2011 | Kim | ................... | G11C 13/0069 |
| | | | | 365/148 |
| 2012/0011090 A1* | 1/2012 | Tang | ...................... | G06N 3/088 |
| | | | | 706/33 |
| 2012/0146546 A1* | 6/2012 | Hu | ...................... | H05B 45/3725 |
| | | | | 315/297 |
| 2014/0028347 A1* | 1/2014 | Robinett | .............. | H03K 19/173 |
| | | | | 326/38 |
| 2014/0177322 A1* | 6/2014 | Kwon | .................. | G11C 13/004 |
| | | | | 365/148 |
| 2018/0075337 A1* | 3/2018 | Buchanan | .......... | G11C 13/0007 |
| 2019/0122102 A1* | 4/2019 | Leobandung | .......... | G06N 3/084 |
| 2021/0064979 A1* | 3/2021 | Ido | ....................... | G06N 3/0635 |

OTHER PUBLICATIONS

Author Unknown, "Artificial Neural Network", Accessed online Mar. 16, 2023, <https://en.wikipedia.org/wiki/Artificial_neural_network> (Year: 2023).*

* cited by examiner

COMPUTING CIRCUITRY

FIELD OF DISCLOSURE

The field of representative embodiments of this disclosure relates to methods, apparatus and/or implementations concerning or relating to computing circuitry and, in particular, to the configuration and operation of circuitry for analogue computing, for example for neuromorphic computing.

BACKGROUND

There are a number of applications which may, in operation, involve a significant amount of computation. Computing is often performed in the purely digital domain using suitable processors, e.g. based on the Von Neumann architecture. There are some applications however where it may be advantageous to perform computation, at least partly, in the analogue domain. Computing in the analogue domain, or analogue computing, may involve processing data values where at least some data values are represented by the analogue values of some electrical property, e.g. instantaneous voltage or current, or possibly average values of voltage or current over a defined time period.

For instance, artificial neural networks (ANNs) are increasingly being proposed for use in a number of different areas, e.g. for classification or recognition purposes. An ANN typically comprises a number of processing nodes or artificial neurons. Each processing node can receive a plurality of data inputs and generate an output based on a weighted combination of the data inputs and a transfer function. Typically the processing nodes may be arranged in layers and the output of a processing node of one layer may be provided to one or more processing nodes of a succeeding layer.

In order to perform a particular task, the ANN may be initially trained using a training data set during a learning or training stage, where training data is supplied to the ANN, and weightings, applied by individual neurons or nodes of the network to their inputs, are adjusted based on the task being performed. The training stage requires a significant amount of processing to accurately determine the best weights to use for the task being performed. The ANN is thus typically trained in a centralised way in a suitable computing facility, e.g. a high performance server or the like. Once trained, the ANN can be used during an inference process with newly acquired data, e.g. for classification or recognition purposes. The learned weights may be supplied together with an inference engine or system, which is subsequently arranged to receive operational data and for the constituent neurons to apply the programmed weights to their data inputs and provide the system outputs.

Performing inference using an artificial neural network (ANN) is one example of an application that may involve significant computation, for instance matrix multiplication, during operation. It has been proposed that at least some of the computation associated with an ANN may advantageously be implemented using computing circuitry where computing is performed, at least partly, in the analogue domain. This may offer advantages in terms of power, circuitry area and/or processing speed compared to purely digital computing.

SUMMARY

Embodiments of the present disclosure relate to methods, apparatus and systems for computing that performs computing, at least partly in the analogue domain.

Accordingly there is provided, in one aspect computing circuitry comprising a plurality of current generators, each current generator being configured to generate a defined current based on a respective input data value. A memory array is configured to, in use, receive the defined current from each of the current generators at a respective signal line. The memory array comprises at least one set of programmable-resistance memory cells, wherein a set of programmable-resistance memory cells comprises a memory cell associated with each signal line that, in use, can be connected between the relevant signal line and a reference voltage so as to generate a voltage on the signal line. An adder module is coupled to each of said signal lines to generate a voltage at an output node based on the sum of the voltages on each of the signal lines.

In some examples the memory array may comprise a plurality of sets of programmable-resistance memory cells that can be individually selected to receive the defined currents from the current generators. The computing circuitry may then be configured to operate in a sequence of computing operations to generate the voltage at the output node, wherein a different set of programmable-resistance memory cells is selected from one operation to the next. Each programmable-resistance memory cell may be connected to its associated signal line via a cell select switch.

In some instances at least some, and possibly each, of the programmable-resistance memory cells may comprises at least one memristor. In some examples at least some of the programmable-resistance memory cells may comprise a plurality of memristors that can be individually programmed to different resistances. At least some programmable-resistance memory cells may be programmable to any of at least 32 different resistance values.

In some examples, the adder module may comprise a plurality of capacitors, wherein a first plate of each capacitor can be connected to a respective signal line via an input switch and the first plate of each capacitor can be connected to the output node via an output switch. A second plate of each capacitor may be coupled to the reference voltage. The adder module may be operable in a charging phase and a sharing phase. In the charging phase, the input switch for each capacitor may be closed and the output switch for each capacitor open, so to charge each capacitor based on the voltage of the relevant signal line. In the sharing phase, the input switch for each capacitor may be open and the output switch for each capacitor may be closed to share charge between the capacitors. In some implementations the adder module may be one of two adder modules and the computing circuitry may be configured to operate one of the two adder modules in the charging phase whilst the other of the two adder modules is operating in the sharing phase.

In some examples, the adder module may comprise a plurality of transistors, each transistor being connected in parallel between the output node and the reference voltage. A gate control signal for each transistor may be derived from a respective signal line. The adder module may also comprise a capacitor connected between a voltage rail and the output node.

In some examples, each current generator may comprise a current digital-to-analogue converter for generating the defined current with a magnitude that depends on its input data value.

In some examples, each current generator may comprise a time-encoding current generator for generating a defined current with a first magnitude for a proportion of a cycle period defined by the input data value and with a second magnitude for a remainder of the cycle period so that the average current over the cycle period depends on the input data value. The second magnitude may, in some example, be zero. In examples where the adder module is operable in a charging phase and a sharing phase, the computing circuitry may be configured such that, in the charging phase of the adder module, the capacitors of the adder module are connected to the respective signal lines via respective resistances. The charging phase may have a duration equal to one or more cycle periods of the time-encoding current generator.

The computing circuitry may, in some examples, comprise read-out circuitry configured to sample the voltage at the output node. The read-out circuitry may comprise a digital-to-analogue converter.

Computing circuitry as described in any of the variants herein may be implemented as at least part of an artificial neural network. In another aspect there is provided an artificial neural network apparatus comprising computing circuitry according to any of the variant described herein.

In a further aspect there is provided an electronic device comprising computing circuitry according to any of the variant described herein. The electronic device may be at least one of: a battery powered device; a portable device; a communications device; a smartphone; a computing device; a laptop, notebook or tablet computing device; a wearable device; a smartwatch; a voice controlled or activated device; a smart speaker; a domestic appliance.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above performing inference using an artificial neural network (ANN) is one example of an application that may involve significant computation, for instance matrix multiplication, during operation and, for which, conventional digital processing based on the Von Neumann architecture may have disadvantages, e.g. in power consumption.

As noted it has been proposed that at least some of the computation associated with an ANN may be implemented using computing circuitry where computing is performed, at least partly, in the analogue domain. For instance, neuromorphic computing may use at least some analogue or mixed-signal circuitry that can implement a model of a neural system, e.g. an ANN.

For instance, it has been proposed that an array of memristors, can be used to provide computation, where the memristors can be programmed to act as memory elements for storing data values, e.g. weight values.

The term memristor is used herein to refer to an electronic element that has a variable resistance which can be controlled or varied and which has some memory such that a particular resistance state persists in the absence of applied power. Binary memristor elements have been proposed, for instance based on MRAM (Magnetoresistive random-access memory) or ReRAM (Resistive random-access memory) memory, that can exhibit either a high resistance state or a low resistance state and can be selectively programmed to operate in the desired state, for instance by applying suitable programming voltages. The programmed state may persist, in the absence of any applied power, and thus the memristor can be seen as non-volatile memory which can be read by determining whether the element is in the high resistance or the low resistance state. An individual MRAM or ReRAM memory or memristor element may thus be used as binary memory element.

Figure 1:
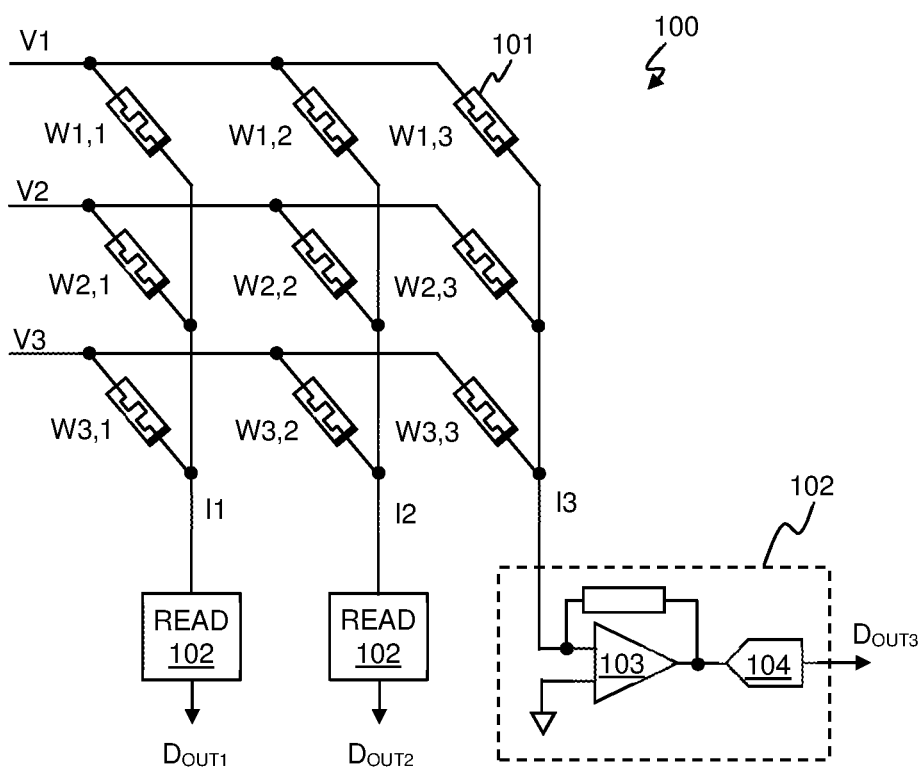
FIG. 1 illustrates a known example of a memristor crossbar array.

FIG. 1 illustrates one known proposal for computing using a memristor array. FIG. 1 illustrates a crossbar array 100 with, in this example, three row electrodes arranged as input electrodes and three column electrodes arranged as output electrodes. Each input electrode is connected to each output electrode via a respective memristor 101, and the output electrodes connect to read-out circuitry 102, which in the arrangement illustrated in FIG. 1, includes a transimpedance amplifier 103 and an analogue-to-digital converter (ADC) 104 for converting the output of the transimpedance amplifier 103 to a respective digital output $D_{OUT1}$, $D_{OUT2}$, $D_{OUT3}$.

Input data may be provided to each input electrode of the array, encoded as a respective voltage level, V1, V2, V3. Digital input data can be received and converted to an appropriate voltage by a suitable digital-to-analogue converter (DAC) (not shown in FIG. 1). The voltage applied to each row electrode will give rise to a current contribution to each column electrode, based on the respective voltage at that input and the resistance state, or equivalently the conductance (which is the inverse of the resistance), of the relevant memristor. The input to the read-out circuitry 102 is a virtual earth and so the current contribution to a given column or output electrode k due to the voltage at a given row or input electrode j will effectively be equal to the voltage Vj at input j multiplied by the conductance Gj,k of the memristor linking input electrode j to output electrode k. If the memristor linking input electrode j to output electrode k is programmed to represent a relevant weight value, the current contribution from input row electrode j to output column electrode k is proportional to the product of the input data value and the relevant weight value.

The current contributions from each row electrode will combine to provide an overall current I1, I2, I3 for the respective column electrodes, which is input to read-out circuitry 102. The respective current for each column is thus equivalent to the sum of the current contributions from each input row electrode via a respective memristor. The current supplied to the read-out circuitry 102 from a given column, e.g. I1, thus is proportional to the dot-product of the vector of input data values with the vector of respective weight values for that output column. The transimpedance amplifier 103 converts the current to a corresponding voltage, which can be converted to a digital output $D_{OUT1}$, $D_{OUT2}$, $D_{OUT3}$ by the ADC 104.

FIG. 1 illustrates a three-by-three crossbar array with three input electrodes and three output electrodes. It will be understood however that the principle could apply to a different number of inputs and/or outputs and the number of inputs could be different to the number of outputs. In some applications, such as implementing part of an ANN, there may be a relatively large number of inputs, as the vector of input data values may be relatively large. In practical terms, this means that a large number of components are all connected to the virtual earth of the read-out circuitry which can impact the gain of the op-amp of the transimpedance amplifier and result in undesirable noise performance.

Embodiments of the present disclosure relate to methods, apparatus and/or implementations concerning or relating to computing circuitry, in particular to analogue computing circuitry such as may be used for neuromorphic computing.

Figure 2:
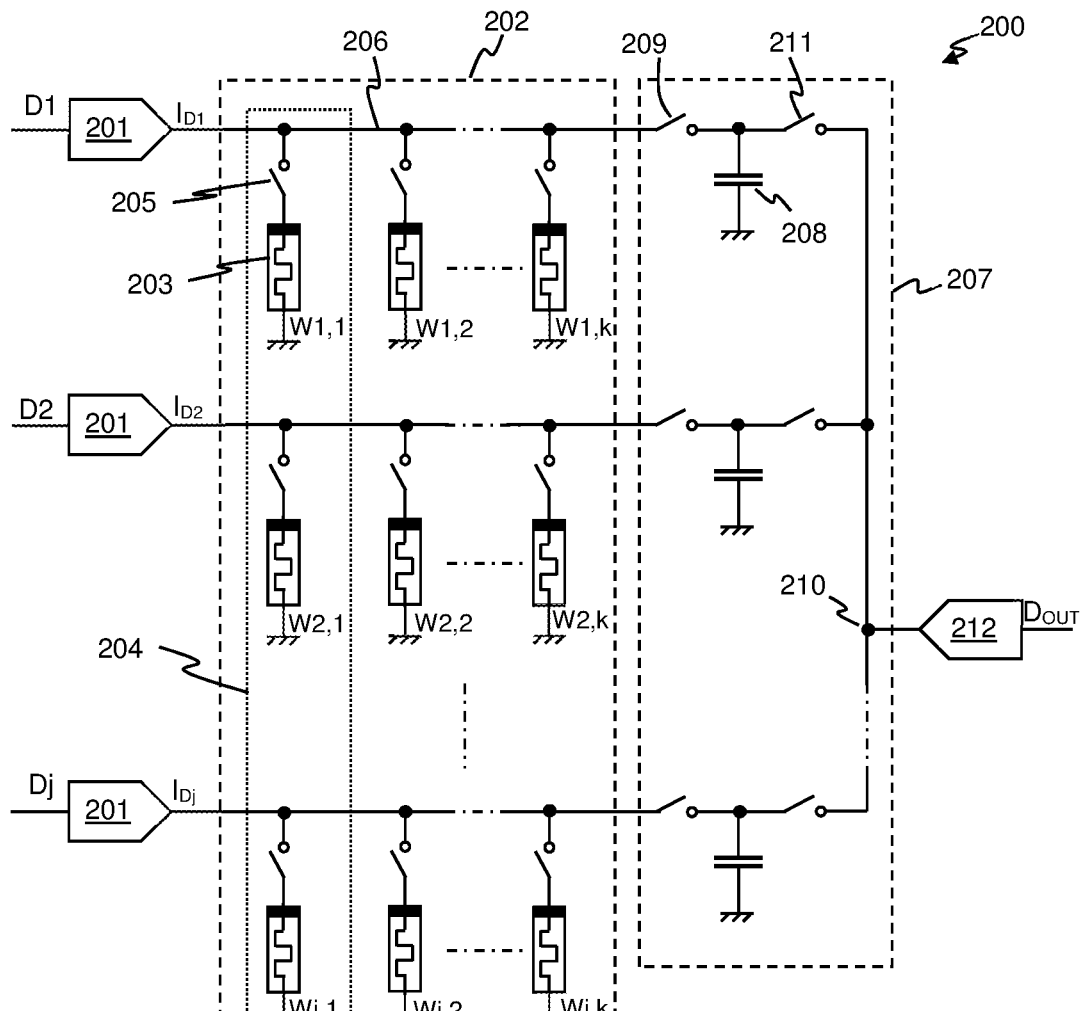
FIG. 2 illustrates one example of some computing circuitry according to an embodiment.

FIG. 2 illustrates one example of computing circuitry 200 according to an embodiment. The computing circuitry comprises a plurality of current generators 201, in this example IDACs (current DACs), for generating a defined current based on an input data value. FIG. 2 illustrates that there is a plurality of IDACs 201, each respective IDAC receiving a respective one of the input data values, D1 to Dj, and generating a corresponding current $I_{D1}$ to $I_{Dj}$. The output of each IDAC 201 is coupled to a respective input of a memory array 202.

The memory array 202 comprises a plurality of programmable-resistance memory cells 203, each of which can be programmed to store a desired value, in this example a weight value (e.g. $W_{1,1}$ or $W_{2,1}$). The memory array 202 comprises at least one set 204 of memory cells 203, wherein each set 204 of memory cells comprises a respective memory cell 203 associated with each input from an IDAC 201, so that, in use, the memory cell 203 can receive the defined current from the relevant IDAC 201. Each set 204 of memory cells may thus be used to store an appropriate vector of weight values to be applied to the input data (e.g. the set of weight values $W_{1,1}$ to $W_{j,1}$, corresponds to a first vector of j weight values).

FIG. 2 illustrates that there are a plurality of sets of memory cells for storing a plurality of different weight vectors, in this example there are k different sets. To allow a desired set of memory cells to be selected, each programmable-resistance memory cell 203 is connected in series with a cell select switch 205. When the cell select switch 205 is closed, the relevant memory cell is connected between a signal line 206, coupled to the output of the relevant IDAC 201, and a reference voltage, in this example ground. When the cell select switch 205 is closed, that memory cell is disconnected from the signal line 206. An appropriate set 204 of memory cells 203 can thus be selectively connected to the respective signal lines by control of the cell select switches 205.

In the example of FIG. 2, the programmable-resistance memory cells 203 comprise memristors. In some implementations the memristors could be memristors capable of being programmed to any of a number of different resistances so as to allow encoding of a weight value to a desired resolution, say to 32 or more different weight values, e.g. a 5-bit resolution or more, e.g. a 6-bit or 8-bit resolution or greater. In some examples the programmable-resistance memory cells 203 may comprise binary memristors, capable of adopting any of two distinct resistance values, but each cell may comprise a plurality of memristors configured such that the memory cell 203 can exhibit an overall resistance that allows encoding of a multibit weight value, as will be discussed in more detail below.

Embodiments will be described herein where the programmable-resistance memory elements of the memory cells 203 are memristors. As described above memristors, for instance based on MRAM or ReRAM technology are known and may be implemented. However there may be other types of programmable-resistance memory elements that could be used for at least some of the programmable-resistance memory elements.

For instance the programmable-resistance memory elements could comprise or be based on flash-based memory e.g. floating-gate technologies such as ESF3, charge-trap technologies such as (SONOS) Silicon-Oxide-Nitride-Oxide-Silicon technologies, fuses (polysilicon or metal), carbon nanotubes or some non-memristive MRAM technologies such as spintronic technology.

In operation, each of the IDACs 201 of FIG. 2 generates a defined current, with a magnitude based on the input data, whilst a memory cell 203 of a relevant set 204 is connected to the signal line 206 (by closing the relevant cell select switch 205 whilst the cell select switches for the other memory cells are open). The defined current is thus steered through the selected programmable-resistance memory cell 203. The defined current flowing through the programmable-resistance elements of the memory cell results in a voltage difference across the cell that depends on the defined current and the overall resistance of the memory cell. This results in a voltage on signal line 206 which, with respect to the reference voltage, is substantially equal to the product of the defined current output from the relevant IDAC and the resistance of the selected programmable-resistance memory cell. The voltage on signal line 206 is thus indicative of the product of the relevant input data value with the weight value stored by the selected memory cell 203.

To provide summation, the voltages developed on each of the signal lines 206 are supplied to adder module 207. The adder module 207 operates to generate a voltage corresponding to the sum of the voltages at each input signal line 206.

In the example of FIG. 2 the adder module 207 comprises a switched-capacitor adder. The adder module thus comprises, for each input, a capacitor 208 that can be selectively coupled between the relevant signal line 206 and the reference voltage by an adder-input switch 209 and which can be coupled to an output node 210 by an adder-output switch 211.

In operation, the adder module 207 of FIG. 2 operates in two phases, a charging phase and a sharing phase. In the charging phase, all the adder-input switches 209 are closed (at least for inputs that are receiving data) and all the adder-output switches 211 are open, so that each capacitor 208 is connected to a respective signal line 206 and isolated from the output node 210 and one another. Each capacitor 208 is thus charged to the respective voltage that corresponds to the product of the input data and selected weight value for that signal line. In the sharing phase, the adder-input switches 209 are opened and all the adder-output switches 211 are closed, so that all the capacitors 208 of the adder circuit are connected together in parallel between the output node and the reference voltage. This results in charge-sharing between all the connected capacitors of the adder module 207.

The charge on each capacitor 208 at the end of the charging phase will depend on the value of the capacitance and also the relevant charging voltage on the relevant signal line 206. If all the capacitors 208 have substantially the same capacitance, the charge stored on each capacitor at the end of the charging phase with thus be proportional to the respective charging voltage and a common scaling factor (which depends on the capacitance). In this case, at the end of the sharing phase, the total charge will be shared equally amongst the capacitors 208 and thus the charge on each capacitor, and hence the voltage at the output node 210, will be proportional to the average charge at the end of the charging phase and hence the average of the respective charging voltages. As each respective charging voltage represents the value of the product of the relevant input data and selected weight value, the average voltage value is thus proportional to the sum of these products.

The voltage at the output node 210 can be sampled at the end of the sharing phase, by read-out circuitry 212, for example an ADC, to provide an output $D_{OUT}$, e.g. a digital output, which corresponds to the dot-product of the vector of input data values with the vector of selected weight values stored by the selected set of memory cells 203.

After the voltage at the output node 210 has been sampled, the computing circuit may repeat the process, but with a different set 204 of memory cells 203 selected, so as to compute the dot-product for a different vector of weight values. Thus the computing circuitry 200 may operate to sequentially compute a dot-product for a given vector of data input values with each of a series of vectors of weight values.

Thus, for a given vector of input data values D1 to Dj, the set of memory cells 203 from the memory array 202 that correspond to a first vector of weight values, e.g. $W_{1,1}$ to $W_{j,1}$, may be selected by closing the appropriate cell select switches. The current generators, e.g. IDACs, 201 generate the respective defined currents, which results in voltages on each signal line 206 which are then summed by adder module 207 operating in the charging phase and then the sharing phase. The read-out circuitry, e.g. ADC 212 samples the voltage at the output node 210 and outputs a first output value $D_{OUT1}$. The selected first set of memory cells 203 are then deselected, by opening the relevant cell select switches, and a second set of memory cells are selected, corresponding to a second vector of weight values e.g. $W_{1,2}$ to $W_{j,2}$. The adder module 207 again operates in the charging phase followed by the sharing phase and the resultant voltage at the output node sampled to provide the second output value $D_{OUT2}$. This process may be repeated for each set of memory cells 203 of the memory array 202 corresponding to a distinct vectors of weight values, e.g. up to the set of memory cells corresponding to weight values $W_{1,k}$ to $W_{j,k}$. Once the dot-product of the vector of input data values with each of the vectors of weight values has been computed, a new vector of input data values may be loaded.

The computing circuitry 200 illustrated in FIG. 2 thus avoids the need to supply current to a virtual earth and thus can be advantageous compared to the approach discussed with reference to FIG. 1.

Figure 3:
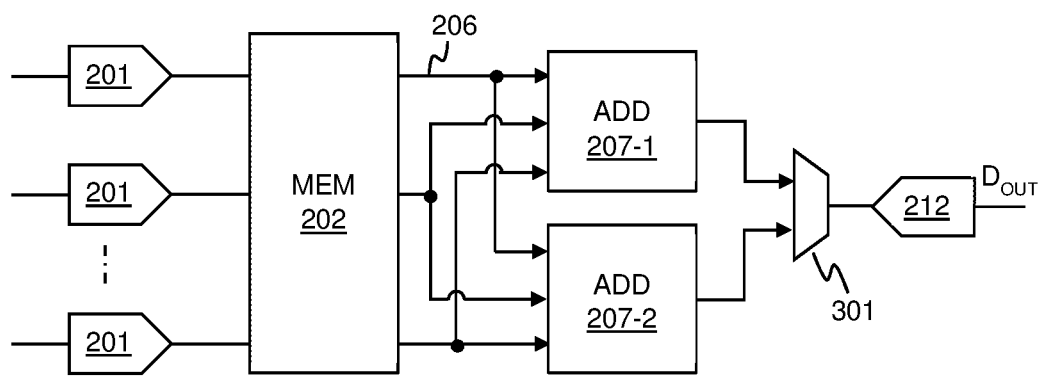
FIG. 3 illustrates an example of computing circuitry with two adder modules.

In the example of FIG. 2, the adder module 207 operates in two phases as discussed above. During the sharing phase, the adder module 206 is effectively disconnected from the memory array 202. In some implementations, to increase processing speed/throughput and reduce latency, the computing circuitry may comprise two adder modules, as illustrated in FIG. 3. FIG. 3 illustrates that there may be first and second adder modules 207-1 and 207-2, each of which is coupled to the signal lines 206 of the memory array 202. In use, the computing circuitry may be configured so that during the sharing phase for one of the adder modules, say 207-1, when that adder module is disconnected from the memory array 202, the memory array 202 is used, with a different set of memory cells selected, to provide the relevant voltages for the charging phase of the other adder module. The output of the appropriate adder module 207-1 or 207-2 may be selectively applied to the ADC 212, e.g. by multiplexor 301.

As noted above, the memory array 202 illustrated in FIG. 2 comprises a plurality of sets of memory cells that can be individually selected so that the memory array effectively stores a plurality of different vectors of weight values that may be applied to a given set of input data values. This means that only a single current generator 201, e.g. IDAC, is required for each input data value. However, the need for sequential processing of the different weight vectors may add to the processing latency. In some implementations the number of sets of memory cells in the memory array 202 may be limited so as to achieve a certain processing speed or throughput. In which case, if it is wished to process the same input data vector with a greater number of weight vectors, there may be more than one computing circuit, each with a memory array storing different sets of weight vectors, and the same data may be applied, in parallel to the different computing circuits.

Figure 4:
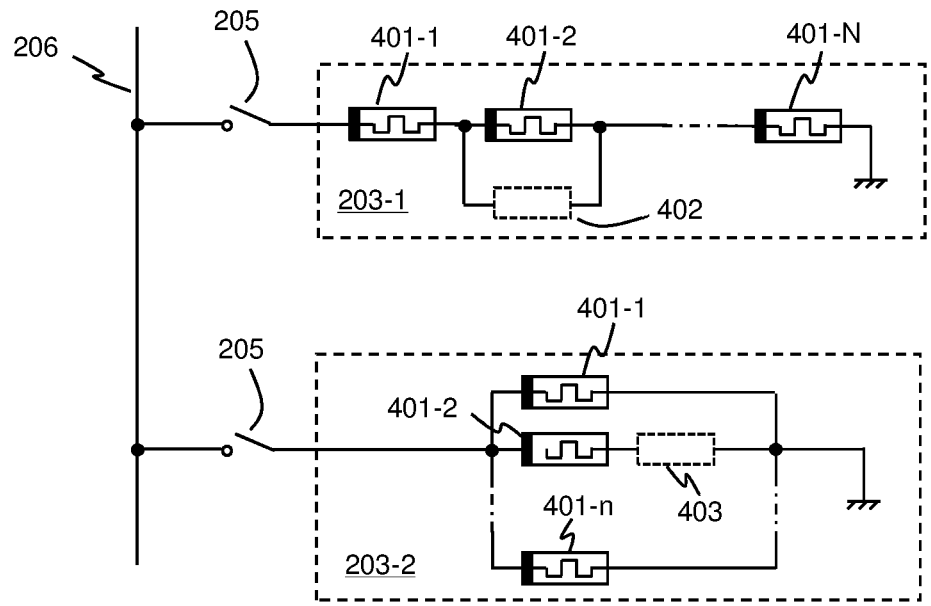
FIG. 4 illustrates some examples of possible memory cell configurations.

As discussed above, the memory cells 203 may be configured to provide a desired resolution for the weight values, which may in some instances be of the order of a 6-bit resolution. Conveniently a memory cell may be implemented by a just one programmable-resistance element, such as a suitable memristor, that may be programmable to a suitable range of different resistance values. However, practically, in some implementations the memory cells may comprise programmable resistance elements that may adopt fewer distinct resistance states, but the memory cells may comprise a plurality of resistance elements in a configuration that provides the desired resolution. For instance a memory cell 203 could comprise a plurality of memristors arranged in series or parallel, or some series parallel combination. FIG. 4 illustrates two examples of configurations for memory cells.

FIG. 4 illustrates that a memory cell 203-1 may comprise a plurality of memristors 401-1 to 401-N in series. The memristors may be configured so that they may be independently programmable to at least two different resistance states. The memristors 401-1 to 401-N may, for instance, be binary memristors. The memristors 401-1 to 401-N of the memory cell may be programmed according to a desired coding scheme. For instance the memristors may be substantially identical and could be programmed according to unary encoding. In some instances the memristors could be configured so that the effective resistance of memristors in the series connection vary from one another by a desired scaling, e.g. a binary weighting. For example, one memristor may be capable of adopting a resistance R1 in one state, say a high resistance state whereas another memristor may be capable of adopting a resistance of 2*R1 in its high resistance state. The scaling in resistance may be achieved by using memristors with different resistance characteristics and/or by connecting at least some of the memristors in parallel with an additional resistance element 402. The additional resistance element 402 may be another memristor or a defined resistor.

FIG. 4 also shows that a memory cell 203-2 may also comprise a plurality of memristors 401-1 to 401-$n$, but connected in parallel. Again the memristors may be independently programmed to at least two resistance states and at least some memristors may be coupled in series with an additional resistance element 403 to tune the overall resistance to desired values, and to provide appropriate scaling of the effective resistances.

It will be understood however that FIG. 4 illustrates just two examples and there are many other ways that programmable-resistance elements may be configured to provide a desired resolution in different overall resistance for a memory cell. It will also be understood that whilst FIG. 4 shows two memory cells of different configurations connected to the same signal line 206 for the purposes of explanation, in practice it may be preferred that each memory cell of a memory array has the same general configuration for consistency.

The current generators 201 may, as discussed above, be IDACs which generate a current with a magnitude that depends on the input data value. The IDACs should conveniently be low power and have a desired resolution, for instance of the order of a 6-bit or 8-bit input resolution. There are various IDACs that could be used, as would be understood by one skilled in the art.

In some embodiments, rather than output a continuous defined current with a magnitude that encodes the input data value, the current generators 201 may be configured as time-encoding current generators which generate a defined current that, over the duration of a defined cycle period, has an average value that depends on the input data value. For instance, the current generators 201 may comprise PWM current generators that output a defined current of a first magnitude for a proportion of the cycle period that depends on the input data. For the rest of the cycle period the current may be zero or have some non-zero magnitude different to the first magnitude.

Figure 5:
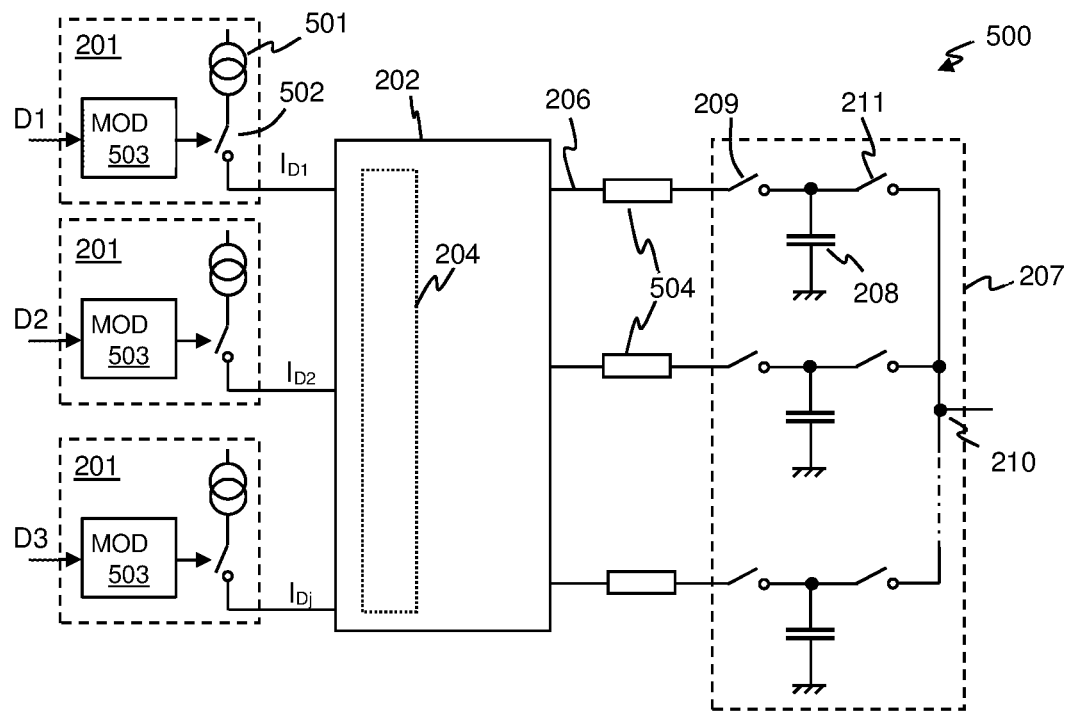
FIG. 5 illustrates another example of some computing circuitry according to an embodiment.

FIG. 5 illustrates an example of some computing circuitry 500 according to an embodiment that includes time-encoding current generators 201, in which similar components to those discussed previously are identified by the same reference numerals. In FIG. 5 the structure of the memory array 202 is omitted for clarity but could be the same as discussed with reference to FIG. 2.

In the example of FIG. 5 each time-encoding current generator comprises a current source 501 for generating a current of a first magnitude. The current generator also has a switch 502 for selectively supplying the current generated by the current source 501 to the respective input of the memory array 202. The switch 502 is controlled by modulator 503 which receives the relevant input value. The modulator may, for instance, be a PWM modulator as would be well understood by one skilled in the art.

The switch 502 is thus controlled to supply the current from the current source for a certain duration in each PWM cycle as defined by the input data, and then to prevent supply of current during the rest of the cycle. The average current supplied over the course of the cycle period thus depends on the input data value.

When current is being supplied to the signal line 206 of the memory array 202, the current will flow via a selected memory cell 203 and generate a voltage as discussed above. However, whilst the instantaneous voltage will depend on the resistance of the memory cell, and hence the weight value, the instantaneous voltage, in this case, does not depend on the data value. In this example the computing circuitry 500 thus includes, for each capacitor 208 of the adder module, an associated resistance 504 that, in the charging phase of the adder module 207, is connected in series with the capacitor.

The value of resistance 504 may be selected so that the resistance, together with the associated capacitor 208, act, over the course of the PWM cycle period, as an RC integrator. Thus, during the course of the PWM cycle, the capacitor 208 is charged to a voltage that is an average of the voltage of the signal line 206 over the course of the PWM cycle—or, in other words the capacitor 208 stores an amount of charge that is proportional to the total charge supplied over the PWM cycle period and hence is proportional to the average current and hence the input data value.

The computing circuitry 500 may be operated in a similar way as discussed above, with the charging phase of the adder module being timed to coincide with the PWM cycle frequency of the time-encoding current generators. In some embodiments, however, the charging phase of the adder module 207 may last for a plurality of PWM cycle periods. If the RC characteristic of the resistance 504 and capacitor 208 is designed to have a frequency cut-off that is lower than the PWM cycle frequency, the resistance 504 and capacitance 208 act as a filter that provides averaging over the multiple PWM cycles. Performing such an averaging over multiple PWM cycles may provide better accuracy, but each charging phase lasts for multiple PWM cycles. In either case, the adder module 207 will generate, at the end of the sharing phase, a voltage at the output node 210 which is proportional to the dot-product of the input data values and the selected weight value which can be sampled by an ADC as discussed.

Note that the resistances 504 could be resistors that are specifically included to provide the integration and/or filtering response required, but in some embodiments the resistance could be provided by some components that may in any case be provided to enable other functions, e.g. the adder-input switches 209.

A time-encoding current generator 201, such as discussed with respect to FIG. 5, may be readily implemented to be relatively low power and with good accuracy at the desired resolution.

As noted, in some implementations the computing circuitry 500 may include read-out circuitry 212 to process the output from the adder-module. In some examples the read-out circuitry 212 may comprise an ADC which may be any suitable voltage input ADC. In the examples described, the input voltage for the read-out circuitry 212 is maintained on the capacitors 208, and thus a suitable ADC may, in some instances determine an output value by determining the time taken to discharge one or more of the capacitors 208 to a defined reference, in which case the output may be a time-encoded signal. Such a time-encoded signal may be useful in an implementation having multiple layers, as the time-encoded output from one layer could be used as an input of a time-encoding current generator of a subsequent layer.

The read-out circuitry 212 may simply determine and output a value that corresponds to the voltage at the output node, i.e. may convert the voltage to a corresponding output value, such as a digital output value or PWM-pulse. In some instances however the read-out circuitry 212 could apply some processing. For example, it will be understood by one skilled in the art that for an ANN the sum of the weighted input values, i.e. the dot-product, may be subject to a non-linear transfer function, e.g. an activation function. In some instances the non-linear function may be applied downstream e.g. in the digital domain to a digital output from an ADC of the read-out circuitry. However it would be possible to apply the non-linear function to the analogue voltage value, for instance before, or as part of, read-out. For instance where the read-out circuitry comprises an ADC that determines the time taken to discharge one or more of the capacitors 208, the discharging current may vary over time to implement a non-linear function.

Figure 6:
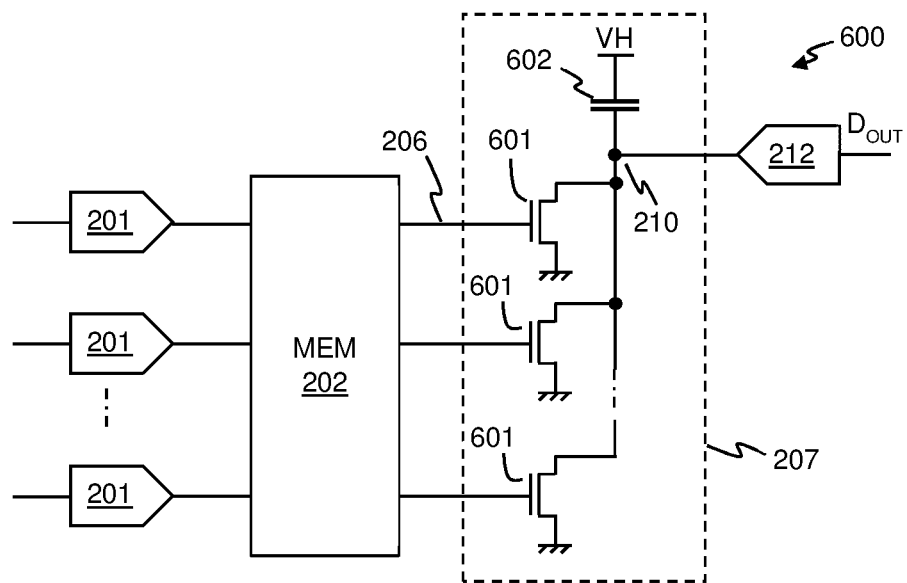
FIG. 6 illustrates an example of some computing circuitry with a current-mode adder module.

The adder module 207 discussed above uses switched capacitors in charging and sharing phases to effectively provide addition (and averaging) of the voltages on the capacitor. FIG. 6 illustrates a further example of some computing circuitry 600 with an alternative implementation of adder module 207. FIG. 6 illustrates that the computing circuitry 600 comprises a plurality of current generators 201 and a memory array 202 as discussed above. In the example of FIG. 6, the adder module 207 provides current mode addition. The adder module 207 comprises, for each input signal line 206 from the memory array 202, a transistor 601 with a gate terminal driven by the voltage on the relevant signal line. Each transistor 601 is coupled between the output node 210 and, in this example, ground. A capacitor 602 is also coupled between the output node 210 and a voltage rail VH, which may be at a voltage which is greater than an expected voltage for any of the signal lines 206. In operation, the transistors 601 are controlled by the voltages developed on the relevant signal line 206 and thus the current that flows through each transistor 601 will depend on the relevant voltage on the signal line, i.e. the transistors operate in the linear region. The total current through the output node 210 will thus be the sum of the individual currents through each of the transistors 601. This current flow will vary the charge on the relevant plate of capacitor 602 and thus result in a voltage change corresponding to the overall current. The voltage at the output node 210 may thus be sampled after a defined period by output read-out circuitry, e.g. ADC 212. If the current generators 201 comprise time-encoding current generators such as described with reference to FIG. 5, the defined sampling period may be equal to one or more cycle periods of the modulator 503, e.g. PWM cycles, as the voltage at the output node 210 will depend on the total current through each transistor 601 over the whole of the cycle period.

The computing circuitry of the embodiments described above can thus perform computing operations such as generating the dot-product of a vector of input data values with one or more stored vectors of weight values. The memory array 202 stores the weight values in a way that they can be used directly for analogue computing without requiring memory reads and writes, as would be required for digital computing, and a relatively large number of input data values may be processed in parallel. The computing circuitry according to the present embodiments avoids the need for a virtual earth connected to a large number of components. The computing circuitry may consume relatively low power in use.

Figure 7:
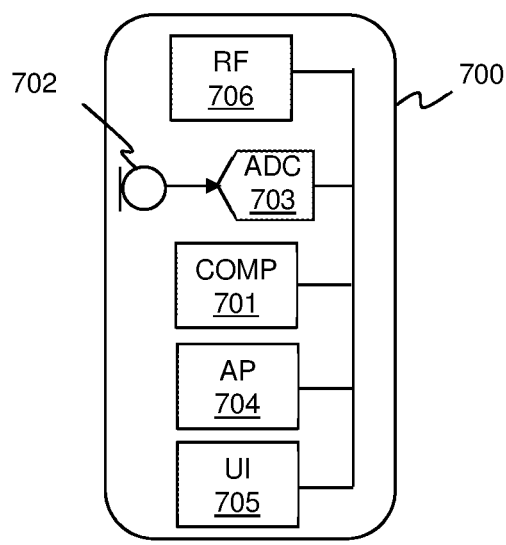
FIG. 7 illustrates an electronic device including the computing circuitry.

Computing circuitry according to embodiments may be implemented in an electronic device. FIG. 7 illustrates an electronic device 700 comprising a computing circuit 701 which may be implemented by computing circuitry according to any of the variant described herein. The electronic device may be a portable or battery powered device, for instance a tablet or laptop computer, or smartphone or smartwatch or the like, or a communications interface device such as a smart speaker or other smart listening device. The device may, in some instance, be a voice controlled or voice activated device. The device could be a domestic appliance. The device may have a microphone 702 and associated ADC 703. In some instances the computing circuit may be operable to process audio data received via the microphone, e.g. for speech and/or speaker recognition. The device may comprise an applications processor (AP) 704 and in some implementations the computing circuitry may be operable to process data received from the AP and/or to provide data to the AP. In some instances the operation of the computing circuit 701 may be configured by the AP 704 in use. The device may have at least one other user interface 705, e.g. for allowing text input and in some applications the computing circuit 701 may be operable to process data received via the UI 705. The electronic device may also comprise an RF unit 706 for sending and receiving data wirelessly, e.g. via WiFi™ or Bluetooth™. The computing circuitry 701 may be operable to process data received via the RF unit 706 and/or to provide data to the RF unit 706 for broadcast. In some embodiments the weight values to be stored in the memory cells may be received or updated via the RF unit 706.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Computing circuitry comprising:
   a plurality of current generators, each current generator being configured to generate a defined current based on a respective input data value;
   a memory array configured to, in use, receive the defined current from each of the current generators at a respective signal line, wherein the memory array comprises at least one set of programmable-resistance memory cells, wherein a set of programmable-resistance memory cells comprises a memory cell associated with each signal line that, in use, can be connected between the relevant signal line and a reference voltage so as to generate a voltage on the signal line;

an adder module coupled to each of said signal lines to generate a voltage at an output node based on the sum of the voltages on each of the signal lines.

2. Computing circuitry as claimed in claim 1 wherein the memory array comprises a plurality of sets of programmable-resistance memory cells that can be individually selected to receive the defined currents from the current generators.

3. Computing circuitry as claimed in claim 2 wherein the computing circuitry is configured to operate in a sequence of computing operations to generate the voltage at the output node, wherein a different set of programmable-resistance memory cells is selected from one operation to the next.

4. Computing circuitry as claimed in claim 2 wherein each programmable-resistance memory cell is connected to its associated signal line via a cell select switch.

5. Computing circuitry as claimed in claim 1 wherein each programmable-resistance memory cell comprises at least one memristor.

6. Computing circuitry as claimed in claim 5 wherein each programmable-resistance memory cell comprises a plurality of memristors that can be individually programmed to different resistances.

7. Computing circuitry as claimed in claim 5 wherein at least some programmable-resistance memory cells are programmable to any of at least 32 different resistance values.

8. Computing circuitry as claimed in claim 1 wherein the adder module comprises a plurality of capacitors, wherein a first plate of each capacitor can be connected to a respective signal line via an input switch, the first plate of each capacitor can be connected to the output node via an output switch and a second plate of each capacitor is coupled to the reference voltage.

9. Computing circuitry as claimed in claim 8 wherein the adder module is operable in:
a charging phase, with the input switch for each capacitor closed and the output switch for each capacitor open so to charge each capacitor based on the voltage of the relevant signal line; and
a sharing phase, with the input switch for each capacitor open and the output switch for each capacitor closed to share charge between the capacitors.

10. Computing circuitry as claimed in claim 9 wherein the adder module is one of two adder modules and wherein the computing circuitry is configured to operate one of the two adder modules in the charging phase whilst the other of the two adder modules is operating in the sharing phase.

11. Computing circuitry as claimed in claim 1 wherein the adder module comprises:
a plurality of transistors, each transistor being connected in parallel between the output node and the reference voltage, wherein a gate control signal for each transistor is derived from a respective signal line, and
a capacitor connected between a voltage rail and the output node.

12. Computing circuitry as claimed in claim 1 wherein each current generator comprise a current digital-to-analogue converter for generating the defined current with a magnitude that depends on its input data value.

13. Computing circuitry as claimed in claim 1 wherein each current generator comprise a time-encoding current generator for generating a defined current with a first magnitude for a proportion of a cycle period defined by the input data value and with a second magnitude for a remainder of the cycle period so that the average current over the cycle period depends on the input data value.

14. Computing circuitry as claimed in claim 13 wherein the second magnitude is zero.

15. Computing circuitry as claimed in claim 13, wherein, in a charging phase of the adder module, the capacitor is connected to the respective signal line via a resistance and wherein the charging phase has a duration equal to one or more cycle periods of the time-encoding current generator.

16. Computing circuitry as claimed in claim 1 comprising read-out circuitry configured to sample the voltage at the output node, wherein the read-out circuitry comprises a digital-to-analogue converter.

17. Computing circuitry as claimed in claim 1 implemented as at least part of an artificial neural network.

18. An artificial neural network apparatus comprising computing circuitry as claimed in claim 1.

19. An electronic device comprising computing circuitry as claimed in claim 1.

20. An electronic device as claimed in claim 19 wherein the electronic device is at least one of: a battery powered device; a portable device; a communications device; a smartphone; a computing device; a laptop, notebook or tablet computing device; a wearable device; a smartwatch; a voice controlled or activated device; a smart speaker; a domestic appliance.

* * * * *